(12) United States Patent
Lee et al.

(10) Patent No.: US 7,151,053 B2
(45) Date of Patent: Dec. 19, 2006

(54) METHOD OF DEPOSITING DIELECTRIC MATERIALS INCLUDING OXYGEN-DOPED SILICON CARBIDE IN DAMASCENE APPLICATIONS

(75) Inventors: Ju-Hyung Lee, San Jose, CA (US); Ping Xu, Fremont, CA (US); Shankar Venkataraman, Santa Clara, CA (US); Li-Qun Xia, Santa Clara, CA (US); Fei Han, San Jose, CA (US); Ellie Yieh, San Jose, CA (US); Srinivas D. Nemani, San Jose, CA (US); Kangsub Yim, Mountain View, CA (US); Farhad K. Moghadam, Saratoga, CA (US); Ashok K. Sinha, Palo Alto, CA (US); Yi Zheng, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/118,678

(22) Filed: Apr. 28, 2005

(65) Prior Publication Data

US 2005/0233576 A1 Oct. 20, 2005

Related U.S. Application Data

(63) Continuation of application No. 10/196,498, filed on Jul. 15, 2002, now Pat. No. 6,890,850.

(60) Provisional application No. 60/340,615, filed on Dec. 14, 2001.

(51) Int. Cl.
*H01L 21/4763* (2006.01)
*H01L 21/31* (2006.01)
*H01L 21/469* (2006.01)

(52) U.S. Cl. ............. 438/631; 438/634; 438/638; 438/789

(58) Field of Classification Search ............. 438/631, 438/634, 638, 789
See application file for complete search history.

(56) References Cited

U.S. PATENT DOCUMENTS 3,510,369 A 5/1970 Ernick et al.
4,262,631 A 4/1981 Kubacki (Continued)

FOREIGN PATENT DOCUMENTS

DE 41 26 759 2/1993

(Continued)

OTHER PUBLICATIONS

Tajima, et al. "Characterization of Plasma Polymers from Tetramethysilane, Octamethylcyclotetrasiloxane, and Methyltrimethoxysilane" Journal of Polymer Science: Part A: Polymer Chemistry, vol. 25 (1987) pp. 1737-1744.

(Continued)

*Primary Examiner*—William M. Brewster
(74) *Attorney, Agent, or Firm*—Patterson and Sheridan

(57) ABSTRACT

Methods are provided for depositing an oxygen-doped dielectric layer. The oxygen-doped dielectric layer may be used for a barrier layer or a hardmask. In one aspect, a method is provided for processing a substrate including positioning the substrate in a processing chamber, introducing a processing gas comprising an oxygen-containing organosilicon compound, carbon dioxide, or combinations thereof, and an oxygen-free organosilicon compound to the processing chamber, and reacting the processing gas to deposit an oxygen-doped dielectric material on the substrate, wherein the dielectric material has an oxygen content of about 15 atomic percent or less. The oxygen-doped dielectric material may be used as a barrier layer in damascene or dual damascene applications.

23 Claims, 6 Drawing Sheets

U.S. PATENT DOCUMENTS

| | | |
|---|---|---|
| 4,532,150 A | 7/1985 | Endo et al. |
| 4,634,601 A | 1/1987 | Hamakawa et al. |
| 4,649,071 A | 3/1987 | Tajima et al. |
| 4,759,947 A | 7/1988 | Ishihara et al. |
| 4,795,947 A | 1/1989 | Gleim et al. |
| 4,872,947 A | 10/1989 | Wang et al. |
| 4,894,352 A | 1/1990 | Lane et al. |
| 4,895,734 A | 1/1990 | Yoshida et al. |
| 4,951,601 A | 8/1990 | Maydan et al. |
| 4,981,724 A | 1/1991 | Hochberg et al. |
| 5,000,113 A | 3/1991 | Wang et al. |
| 5,000,178 A | 3/1991 | Griffith |
| 5,003,178 A | 3/1991 | Livesay |
| 5,011,706 A | 4/1991 | Tarhay et al. |
| 5,086,014 A | 2/1992 | Miyata et al. |
| 5,224,441 A | 7/1993 | Felts et al. |
| 5,238,866 A | 8/1993 | Bolz et al. |
| 5,242,530 A | 9/1993 | Batey et al. |
| 5,298,587 A | 3/1994 | Hu et al. |
| 5,298,597 A | 3/1994 | You et al. |
| 5,314,724 A | 5/1994 | Tsukune et al. |
| 5,360,491 A | 11/1994 | Carey et al. |
| 5,362,526 A | 11/1994 | Wang et al. |
| 5,423,941 A | 6/1995 | Komura et al. |
| 5,465,680 A | 11/1995 | Loboda |
| 5,468,978 A | 11/1995 | Dowben |
| 5,480,300 A | 1/1996 | Okoshi et al. |
| 5,494,712 A | 2/1996 | Hu et al. |
| 5,525,550 A | 6/1996 | Kato |
| 5,554,570 A | 9/1996 | Maeda et al. |
| 5,565,084 A | 10/1996 | Lee et al. |
| 5,591,566 A | 1/1997 | Ogawa |
| 5,593,741 A | 1/1997 | Iketa |
| 5,607,773 A | 3/1997 | Ahlburn et al. |
| 5,618,619 A | 4/1997 | Petrmichl et al. |
| 5,628,828 A | 5/1997 | Kawamura et al. |
| 5,638,251 A | 6/1997 | Goel et al. |
| 5,641,607 A | 6/1997 | Ogawa et al. |
| 5,658,834 A | 8/1997 | Dowben |
| 5,679,413 A | 10/1997 | Petrmichl et al. |
| 5,691,209 A | 11/1997 | Liberkowski |
| 5,710,067 A | 1/1998 | Foote et al. |
| 5,711,987 A | 1/1998 | Bearinger et al. |
| 5,730,792 A | 3/1998 | Camilletti et al. |
| 5,741,626 A | 4/1998 | Jain et al. |
| 5,776,235 A | 7/1998 | Camilletti et al. |
| 5,780,163 A | 7/1998 | Camilletti et al. |
| 5,789,316 A | 8/1998 | Lu |
| 5,789,776 A | 8/1998 | Lancaster et al. |
| 5,817,579 A | 10/1998 | Ko et al. |
| 5,818,071 A | 10/1998 | Loboda et al. |
| 5,855,681 A | 1/1999 | Maydan et al. |
| 5,869,396 A | 2/1999 | Pan et al. |
| 5,876,891 A | 3/1999 | Takimoto et al. |
| 5,926,740 A | 7/1999 | Forbes et al. |
| 5,976,979 A | 11/1999 | Chen |
| 5,989,998 A | 11/1999 | Sugahara et al. |
| 6,045,877 A | 4/2000 | Gleason et al. |
| 6,051,321 A | 4/2000 | Lee et al. |
| 6,054,379 A | 4/2000 | Yau et al. |
| 6,057,251 A | 5/2000 | Goo et al. |
| 6,060,132 A | 5/2000 | Lee |
| 6,068,884 A | 5/2000 | Rose et al. |
| 6,071,809 A | 6/2000 | Zhao |
| 6,072,227 A | 6/2000 | Yau et al. |
| 6,080,526 A | 6/2000 | Yang et al. |
| 6,107,192 A | 8/2000 | Subrahmanyan et al. |
| 6,114,259 A | 9/2000 | Sukharev et al. |
| 6,124,641 A | 9/2000 | Matsuura |
| 6,140,226 A | 10/2000 | Grill et al. |
| 6,147,009 A | 11/2000 | Grill et al. |
| 6,153,537 A | 11/2000 | Bacchetta et al. |
| 6,159,871 A | 12/2000 | Loboda et al. |
| 6,169,039 B1 | 1/2001 | Lin et al. |
| 6,242,339 B1 | 6/2001 | Aoi |
| 6,242,530 B1 | 6/2001 | Konig et al. |
| 6,287,990 B1 | 9/2001 | Cheung et al. |
| 6,291,334 B1 | 9/2001 | Somekh |
| 6,303,523 B1 | 10/2001 | Cheung et al. |
| 6,312,793 B1 | 11/2001 | Grill et al. |
| 6,316,167 B1 | 11/2001 | Angelopoulos et al. |
| 6,331,494 B1 | 12/2001 | Olson et al. |
| 6,340,435 B1 | 1/2002 | Bjorkman et al. |
| 6,340,628 B1 | 1/2002 | Van Cleemput et al. |
| 6,344,693 B1 | 2/2002 | Kawahara et al. |
| 6,348,725 B1 | 2/2002 | Cheung et al. |
| 6,352,945 B1 | 3/2002 | Matsuki et al. |
| 6,365,527 B1 | 4/2002 | Yang et al. |
| 6,383,955 B1 | 5/2002 | Matsuki et al. |
| 6,399,489 B1 | 6/2002 | M'Saad et al. |
| 6,410,462 B1 | 6/2002 | Yang et al. |
| 6,410,463 B1 | 6/2002 | Matsuki et al. |
| 6,413,583 B1 | 7/2002 | Moghadam et al. |
| 6,429,121 B1 | 8/2002 | Hopper et al. |
| 6,432,846 B1 | 8/2002 | Matsuki |
| 6,436,824 B1 | 8/2002 | Chooi et al. |
| 6,437,443 B1 | 8/2002 | Grill et al. |
| 6,441,491 B1 | 8/2002 | Grill et al. |
| 6,444,136 B1 | 9/2002 | Liu et al. |
| 6,444,568 B1 | 9/2002 | Sundararajan et al. |
| 6,455,445 B1 | 9/2002 | Matsuki et al. |
| 6,465,366 B1 | 10/2002 | Nemani et al. |
| 6,479,110 B1 | 11/2002 | Grill et al. |
| 6,479,409 B1 | 11/2002 | Shioya et al. |
| 6,486,082 B1 | 11/2002 | Cho et al. |
| 6,489,238 B1 | 12/2002 | Tsui |
| 6,495,448 B1 | 12/2002 | Lee |
| 6,500,773 B1 | 12/2002 | Gaillard et al. |
| 6,511,903 B1 | 1/2003 | Yau et al. |
| 6,511,909 B1 | 1/2003 | Yau et al. |
| 6,528,426 B1 | 3/2003 | Olsen et al. |
| 6,531,714 B1 | 3/2003 | Bacchetta et al. |
| 6,532,150 B1 | 3/2003 | Sivertsen et al. |
| 6,537,733 B1 | 3/2003 | Campana et al. |
| 6,537,929 B1 | 3/2003 | Cheung et al. |
| 6,541,282 B1 | 4/2003 | Cheung et al. |
| 6,541,398 B1 | 4/2003 | Grill et al. |
| 6,548,690 B1 | 4/2003 | Mimoun |
| 6,548,899 B1 | 4/2003 | Ross |
| 6,555,476 B1 | 4/2003 | Olsen et al. |
| 6,559,520 B1 | 5/2003 | Matsuki et al. |
| 6,562,690 B1 | 5/2003 | Cheung et al. |
| 6,573,193 B1 | 6/2003 | Yu et al. |
| 6,573,196 B1 | 6/2003 | Gaillard et al. |
| 6,582,777 B1 | 6/2003 | Ross et al. |
| 6,583,048 B1 | 6/2003 | Vincent et al. |
| 6,583,071 B1 | 6/2003 | Weidman et al. |
| 6,589,888 B1 | 7/2003 | Nemani et al. |
| 6,592,890 B1 | 7/2003 | Green |
| 6,593,247 B1 | 7/2003 | Huang et al. |
| 6,593,633 B1 | 7/2003 | Jan et al. |
| 6,593,653 B1 | 7/2003 | Sundararajan et al. |
| 6,593,655 B1 | 7/2003 | Loboda et al. |
| 6,596,655 B1 | 7/2003 | Cheung et al. |
| 6,624,053 B1 | 9/2003 | Passemard |
| 6,627,532 B1 * | 9/2003 | Gaillard et al. ............. 438/623 |
| 6,642,157 B1 | 11/2003 | Shioya et al. |
| 6,656,837 B1 * | 12/2003 | Xu et al. .................... 438/676 |
| 6,660,391 B1 | 12/2003 | Rose et al. |
| 6,660,656 B1 | 12/2003 | Cheung et al. |
| 6,660,663 B1 | 12/2003 | Cheung et al. |
| 6,703,265 B1 * | 3/2004 | Asami et al. ............... 438/150 |
| 6,730,593 B1 | 5/2004 | Yau et al. |
| 6,734,115 B1 | 5/2004 | Cheung et al. |

| | | |
|---|---|---|
| 6,756,323 B1 | 6/2004 | Grill et al. |
| 6,759,327 B1 | 7/2004 | Xia et al. |
| 6,770,573 B1 | 8/2004 | Grill et al. |
| 6,790,789 B1 | 9/2004 | Grill et al. |
| 6,838,393 B1 | 1/2005 | Yim et al. |
| 6,852,651 B1 * | 2/2005 | Shioya et al. ............... 438/790 |
| 6,875,699 B1 | 4/2005 | Lassig et al. |
| 6,890,850 B1 * | 5/2005 | Lee et al. ................... 438/631 |
| 6,974,766 B1 | 12/2005 | Huang |
| 2001/0005546 A1 | 6/2001 | Cheung et al. |
| 2002/0000670 A1 | 1/2002 | Yau et al. |
| 2002/0045361 A1 | 4/2002 | Cheung et al. |
| 2002/0093075 A1 | 7/2002 | Gates et al. |
| 2002/0098714 A1 | 7/2002 | Grill et al. |
| 2002/0111042 A1 | 8/2002 | Yau et al. |
| 2002/0160626 A1 | 10/2002 | Matsuki et al. |
| 2002/0172766 A1 | 11/2002 | Laxman et al. |
| 2002/0173172 A1 | 11/2002 | Loboda et al. |
| 2002/0187629 A1 | 12/2002 | Huang et al. |
| 2003/0001282 A1 | 1/2003 | Meynen et al. |
| 2003/0003765 A1 | 1/2003 | Gibson, Jr. et al. |
| 2003/0003768 A1 | 1/2003 | Cho et al. |
| 2003/0008511 A1 | 1/2003 | Tsai et al. |
| 2003/0040195 A1 | 2/2003 | Chang et al. |
| 2003/0042605 A1 | 3/2003 | Andideh et al. |
| 2003/0064154 A1 | 4/2003 | Laxman et al. |
| 2003/0068881 A1 | 4/2003 | Xia et al. |
| 2003/0085408 A1 | 5/2003 | Yang et al. |
| 2003/0089988 A1 | 5/2003 | Matsuura |
| 2003/0111730 A1 | 6/2003 | Takeda et al. |
| 2003/0129827 A1 | 7/2003 | Lee et al. |
| 2003/0139035 A1 | 7/2003 | Yim et al. |
| 2003/0139062 A1 | 7/2003 | Grill et al. |
| 2003/0194495 A1 | 10/2003 | Li et al. |
| 2003/0194496 A1 * | 10/2003 | Xu et al. ............... 427/255.28 |
| 2003/0198742 A1 | 10/2003 | Vrtis |
| 2003/0211244 A1 | 11/2003 | Li et al. |
| 2004/0009676 A1 * | 1/2004 | Kim et al. ................... 438/778 |

FOREIGN PATENT DOCUMENTS

| | | |
|---|---|---|
| DE | 196 54 737 | 12/1996 |
| DE | 199 04 311 | 8/1999 |
| EP | 0 613 178 | 2/1994 |
| EP | 0 725 440 | 8/1996 |
| EP | 0 935 283 | 8/1999 |
| EP | 1 029 728 | 8/2000 |
| EP | 1 107 303 | 6/2001 |
| EP | 1 122 770 | 8/2001 |
| EP | 1 176 226 | 1/2002 |
| EP | 1 354 980 | 10/2003 |
| JP | 09-008031 | 1/1997 |
| JP | 9-237785 | 7/1997 |
| JP | 09-320075 | 12/1997 |
| JP | 09-321175 | 9/1999 |
| WO | WO 99/21706 | 5/1999 |
| WO | WO 99/33102 | 7/1999 |
| WO | WO 99/41423 | 8/1999 |
| WO | WO 00/19498 | 4/2000 |
| WO | WO 00/19508 | 4/2000 |
| WO | WO 00/20900 | 4/2000 |

OTHER PUBLICATIONS

Wu, et al "Advanced Metal Barrier Free Cu Damascene Interconnects with PECVD Silicon Carbide Barriers for 90/65-nm BEOL Technology", 2002 IEEE, IEDM pp. 595-598.

Cech, et al. "Thin Plasma-Polymerized Films of Dichloro(Methyl)Phenylsilane," Czechoslovak Journal of Physics, vol. 50 (2000), Suppl. S3, pp. 356-364.

Dijkstra, et al. "Optimization of Anti-Reflection Layers for Deep UV Lithography," Proceedings of SPIE Optical/Laser Microlithography, Bellingham, SPIE, vol. 1927, 1993, pp. 275-286.

Fukuda, et al. "Highly Reliable SiOF Film Formation by ECR-CVD Using $SiF_2H_2$," Symposium on VLSI Technology Digest of Technical Papers IEEE (1996) pp. 114-115.

Ogawa, et al. "Novel ARC Optimization Methodology for KrF Excimer Laser Lithography at Low K1 Factor," *Proceedings of the SPIE. Optical/Laser Microlithography V*, vol. 1674, 1992, pp. 362-375.

Omar "Elementary Solid State Physics: Principles and Applications," Lowell Technological Institute, Addison-Wesley Publishing Company, © 1975, pp. 124, 125.

PCT International Search Report for International Application No. PCT/US99/22425 dated Feb. 11, 2000. (APPM/002966PC).

PCT International Search Report for International Application No. PCT/US04/000374 dated Jun. 18, 2004. (APPM/007653PC).

PCT International Search Report for International Application No. PCT/US02/36229 dated Sep. 3, 2003. (APPM/006392PC).

PCT International Search Report for International Application No. PCT/US02/40034 dated May 19, 2003. (APPM/006084PC).

PCT Partial International Search Report for International Application No. PCT/US99/22317 dated Mar. 21, 2000. (APPM/002966P1PC).

Written Opinion of the International Searching Authority for International Application No. PCT/US04/000374 dated Jun. 18, 2004. (APPM/007653PC).

Written Opinion of the International Searching Authority for International Application No. PCT/US99/22424 dated Apr. 5, 2001. (APPM/002966PC03).

Wrobel, et al. "Oligomerization and Polymerization Steps in Remote Plasma Chemical Vapor Deposition of Silicon-Carbon and Silica Films from Organosilicon Sources", Chemical Material, May 2001, 13, pp. 1884-1895.

* cited by examiner

METHOD OF DEPOSITING DIELECTRIC MATERIALS INCLUDING OXYGEN-DOPED SILICON CARBIDE IN DAMASCENE APPLICATIONS

CROSS-REFERENCE TO RELATED APPLICATIONS

This application is a continuation of U.S. patent application Ser. No. 10/196,498, filed Jul. 15, 2002 now U.S. Pat No. 6,890,850, which application claims benefit of U.S. provisional Patent Application Ser. No. 60/340,615, filed Dec. 14, 2001, which applications are herein incorporated by reference.

BACKGROUND OF THE DISCLOSURE

1. Field of the Invention

The invention relates to the fabrication of integrated circuits and to a process for depositing dielectric layers on a substrate and the structures formed by the dielectric layers.

2. Description of the Related Art

One of the primary steps in the fabrication of modern semiconductor devices is the formation of metal and dielectric layers on a substrate by chemical reaction of gases. Such deposition processes are referred to as chemical vapor deposition or CVD. Conventional CVD processes supply reactive gases to the substrate surface where heat-induced or energy-enhanced chemical reactions take place to produce a desired layer.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 µm and even 0.18 µm feature sizes, and tomorrow's plants soon will be producing devices having even smaller geometries.

To further reduce the size of devices on integrated circuits, it has become necessary to use conductive materials having low resistivity and to use insulators having low dielectric constants (dielectric constants of less than 4.0) to reduce the capacitive coupling between adjacent metal lines. One such low k material comprises silicon, oxygen, and carbon, and may be deposited as a dielectric material in fabricating damascene features. One conductive material having a low resistivity is copper and its alloys, which have become the materials of choice for sub-quarter-micron interconnect technology because copper has a lower resistivity than aluminum, (1.7 µΩ-cm compared to 3.1 µΩ-cm for aluminum), a higher current and higher carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and achieve a precise pattern. Etching with copper using traditional deposition/etch processes for forming interconnects has been less than satisfactory. Therefore, new methods of manufacturing interconnects having copper containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, i.e., vias, and horizontal interconnects, i.e., lines. Conductive materials, such as copper and barrier layer materials used to prevent diffusion of copper into the surrounding low k dielectric are then inlaid into the etched pattern. Any excess copper and barrier layer materials external to the etched pattern, such as on the field of the substrate, are then removed.

However, low k dielectric materials are often porous and susceptible to interlayer diffusion of conductive materials, such as copper, which can result in the formation of short-circuits and device failure. A dielectric barrier layer material is used in copper damascene structures to reduce or to prevent interlayer diffusion. However, traditional dielectric barrier layer materials, such as silicon nitride, often have high dielectric constants of 7 or greater. The combination of such a high k dielectric material with surrounding low k dielectric materials results in dielectric stacks having a higher than desired dielectric constant.

Additionally, low k materials are susceptible to surface defects or feature deformation during polishing and removal of conductive materials under conventional polishing processes. One solution to limiting or reducing surface defects and deformation is to deposit a hardmask over the exposed low k materials prior to patterning and etching feature definitions in the low k materials. The hardmask is resistive to damage and deformation and protects the underlying low k materials during subsequent material deposition and planarization or material removal processes, such as chemical mechanical polishing techniques or etching techniques, to reduce defect formation and feature deformation.

One difficulty when using hardmasks is that conventional hardmask materials do not have sufficient resistivity to polishing, which may result in premature removal of the hardmask and expose the underlying material to the process. The exposed underlying material, such as the low k dielectric material, may be damaged and result in surface defects and feature deformation. Additionally, conventional hardmask materials often have high dielectric constants of 7 or greater, which can produce dielectric stacks having a higher than desired dielectric constant. Current hardmask materials have not satisfactorily produced both low k material and sufficient polishing resistivity to be used in damascene fabrication.

Therefore, there remains a need for an improved process for depositing dielectric materials with reduced or low dielectric constants as barrier layers or hardmasks with a satisfactory polishing resistivity for damascene applications.

SUMMARY OF THE INVENTION

Aspects of the invention generally provide a method for depositing an oxygen-doped silicon carbide layer having a low dielectric constant. In one aspect, the invention provides a method for processing a substrate including introducing a processing gas consisting essentially of a compound comprising oxygen and carbon, and an oxygen-free organosilicon compound to the processing chamber, and reacting the processing gas to deposit a dielectric material on the substrate, wherein the dielectric material comprises silicon, oxygen, and carbon, and has an oxygen content of about 15 atomic percent or less.

In another aspect of the invention, a method is provided for processing a substrate including depositing a barrier layer on the substrate by reacting a processing gas comprising an oxygen-containing organosilicon compound and an oxygen-free organosilicon compound, wherein the dielectric material comprises silicon, oxygen, and carbon, and has an oxygen content of about 15 atomic percent or less, and depositing an intermetal dielectric layer on the barrier layer.

In another aspect of the invention, a method is provided for processing a substrate including depositing at least one dielectric layer on a substrate surface, forming an hardmask layer on the at least one dielectric layer, wherein the hardmask layer is deposited by reacting a processing gas comprising an oxygen-containing organosilicon compound in a plasma to deposit a material containing silicon, carbon, and an oxygen content of about 15 atomic percent or less, defining a pattern in at least one region of the hardmask layer, forming a feature definition in the at least one dielectric layer by the pattern formed in the at least one region of the hardmask layer, depositing a conductive material in the feature definition, polishing the conductive material, wherein the polishing process has a removal rate ratio between the conductive material and the hardmask layer of about 4:1 or greater.

In another aspect of the invention, a method is provided for processing a substrate including depositing a barrier layer on the substrate by reacting a processing gas consisting essentially of carbon dioxide and an oxygen-free organosilicon compound, wherein the dielectric material comprises silicon, oxygen, and carbon, and has an oxygen content of about 15 atomic percent or less and depositing an intermetal dielectric layer on the barrier layer.

BRIEF DESCRIPTION OF THE DRAWINGS

So that the manner in which the above features of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

Figure 1:
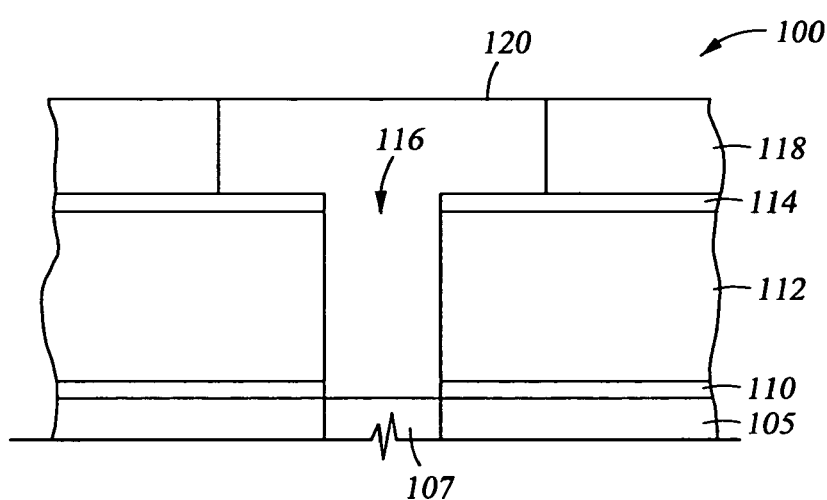
FIG. 1 is a cross sectional view showing a dual damascene structure comprising a low k barrier layer and a low k dielectric layer described herein.

For a further understanding of aspects of the invention, reference should be made to the ensuing detailed description.

DETAILED DESCRIPTION OF THE PREFERRED EMBODIMENTS

Aspects of the invention described herein refer to method for depositing an oxygen-doped silicon carbide layer. Oxygen-doped silicon carbide layers may be deposited by including at least one compound containing oxygen and carbon in a processing gas comprising at least one oxygen-free organosilicon compound. The oxygen-doped silicon carbide layer may then be treated after deposition for modifying layer properties. The oxygen-doped silicon carbide layer typically includes less than about 15 atomic percent (atomic %) of oxygen or less, preferably having between about 3 atomic % and about 10 atomic % or less of oxygen. The oxygen-doped silicon carbide layer may be used as a barrier layer adjacent a conductive material or a hardmask dielectric layer in a metallization scheme for a damascene or dual damascene process.

In one aspect, the oxygen-doped silicon carbide layer may be deposited by reacting a processing gas including an oxygen-containing organosilicon compound and an oxygen-free organosilicon compound to form a dielectric layer comprising carbon-silicon bonds and having a dielectric constant less than about 5. The oxygen-doped silicon carbide layer may be deposited by a plasma-enhanced chemical vapor deposition process.

Suitable organosilicon compounds for the processes described herein include aliphatic organosilicon compounds, cyclic organosilicon compounds, or combinations thereof. Cyclic organosilicon compounds typically have a ring comprising three or more silicon atoms and the ring may further comprise one or more oxygen atoms. Commercially available cyclic organosilicon compounds include rings having alternating silicon and oxygen atoms with one or two alkyl groups bonded to the silicon atoms.

Aliphatic organosilicon compounds have linear or branched structures comprising one or more silicon atoms and one or more carbon atoms, and the structure may further comprise oxygen. Commercially available aliphatic organosilicon compounds include oxygen-free organosilicon compounds, such as alkylsilanes and oxygen-containing organosilicon compounds, such as alkylsiloxanes.

Organosilicon compounds contain carbon atoms in organic groups. Low dielectric constant layers are prepared from organosilicon compounds that have one or more carbon atoms attached to silicon wherein the carbon is not readily removed by oxidation at suitable processing conditions. The organosilicon compounds used preferably include the structure:

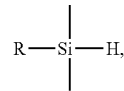

Wherein R includes alkyl, alkenyl, cyclohexenyl, and aryl groups in addition to functional derivatives thereof. However, the invention contemplates the use of organosilicon precursors without Si—H bonds.

Suitable oxygen-free organosilicon compounds include, for example, one or more of the following compounds:

| | |
|---|---|
| Methylsilane, | $CH_3$—$SiH_3$ |
| Dimethylsilane, | $(CH_3)_2$—$SiH_2$ |
| Trimethylsilane (TMS), | $(CH_3)_3$—$SiH$ |
| Ethylsilane, | $CH_3$—$CH_2$—$SiH_3$ |
| Disilanomethane, | $SiH_3$—$CH_2$—$SiH_3$ |
| Bis(methylsilano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$, and |
| 1,3,5-trisilano-2,4,6-trimethylene, | —($SiH_2CH_2$—)$_3$— (cyclic). |

Suitable oxygen-containing organosilicon compounds include, for example, one or more of the following compounds:

| | |
|---|---|
| Dimethyldimethoxysilane, | (CH$_3$)$_2$—Si—(OCH$_3$)$_2$ |
| 1,3-dimethyldisiloxane, | CH$_3$—SiH$_2$—O—SiH$_2$—CH$_3$ |
| 1,1,3,3-tetramethyldisiloxane (TMDSO), | (CH$_3$)$_2$—SiH—O—SiH—(CH$_3$)$_2$ |
| Hexamethyldisiloxane (HMDS), | (CH$_3$)$_3$—Si—O—Si—(CH$_3$)$_3$ |
| 1,3-bis(silanomethylene)disiloxane, | (SiH$_3$—CH$_2$—SiH$_2$—)$_2$—O |
| Bis(1-methyldisiloxanyl)methane, | (CH$_3$—SiH$_2$—O—SiH$_2$—)$_2$—CH$_2$ |
| 2,2-bis(1-methyldisiloxanyl)propane, | (CH$_3$—SiH$_2$—O—SiH$_2$—)$_2$—C(CH$_3$) |
| 1,3,5,7-tetramethylcyclotetrasiloxane (TMCTS), | —(—SiHCH$_3$—O—)$_4$— (cyclic) |
| Octamethylcyclotetrasiloxane (OMCTS), | —(—Si(CH$_3$)$_2$—O—)$_4$— (cyclic) |
| 2,4,6,8,10-pentamethylcyclopentasiloxane, | —(—SiHCH$_3$—O—)$_5$— (cyclic) |
| 1,3,5,7-tetrasilano-2,6-dioxy-4,8-dimethylene, | —(—SiH$_2$—CH$_2$—SiH$_2$—O—)$_2$— (cyclic) |
| Hexamethylcyclotrisiloxane | —(—Si(CH$_3$)$_2$—O—)$_3$— (cyclic). |

The above lists are illustrative and should not be construed or interpreted as limiting the scope of the invention.

The oxygen-free organosilicon compound and an oxygen-containing organosilicon compound react to deposit an oxygen-doped silicon carbide film having about 15 atomic % or less oxygen content and a dielectric constant of less than about 5. An oxygen content between about 3 atomic % and about 10 atomic % should have sufficient barrier layer properties and exhibit a dielectric constant of about 4 or less.

The oxygen-free organosilicon compound comprises at least one silicon-carbon bond and the oxygen-containing organosilicon compound contains a silicon-oxygen bond. For example, the oxygen-free organosilicon compound may be trimethylsilane (TMS) and the oxygen-containing organosilicon compound may be 1,3,5,7-tetramethylcyclotetrasiloxane. The oxygen-free organosilicon compound and the oxygen-containing organosilicon compound are reacted at a molar ratio less than 10:1, preferably a molar ration between about 4:1 and about 1:1.

The processes described herein are preferable performed in a processing chamber adapted to chemically mechanically deposit organosilicon material while applying RF power, such as a DxZ™ chemical vapor deposition chamber, commercially available from Applied Materials, Inc., Santa Clara, Calif. Generally, the organosilicon compounds are reacted in a plasma comprising a noble gas, such as helium, argon or an inert gas, such as nitrogen (N$_2$). The deposited silicon carbide layers have dielectric constants of about 5 or less, preferably about 4 or less.

An oxygen-doped silicon carbide layer may be deposited in one embodiment by supplying organosilicon compounds, such as trimethylsilane and/or 1,3,5,7-tetramethylcyclotetrasiloxane, to a plasma processing chamber at a flow rate between about 10 milligrams/minute (mgm) and about 1500 mgm, respectively, optionally supplying an oxidizing gas at a flow rate between about 10 sccm and about 2000 sccm, supplying a noble gas at a flow rate between about 1 sccm and about 10000 sccm, maintaining a substrate temperature between about 0° C. and about 500° C., maintaining a chamber pressure below about 500 Torr and an RF power of between about 0.03 watts/cm$^2$ and about 1500 watts/cm$^2$.

The RF power can be provided at a high frequency such as between 13 MHz and 14 MHz or a mixed frequency of the high frequency and the low frequency. For example, a high frequency of about 13.56 MHz may be used as well as a mixed frequency of high frequency of about 13.56 MHz and low frequency of about 356 KHz. The RF power can be provided continuously or in short duration cycles wherein the power is on at the stated levels for cycles less than about 200 Hz and the on cycles total between about 10% and about 30% of the total duty cycle. Additionally, a low frequency RF power may be applied during the deposition process. For example, an application of less than about 300 watts, such as less than about 100 watts at between about 100 KHz and about 1 MHz, such as 356 KHz may be used to modify film properties, such as increase the compressive stress of a SiC film to reduce copper stress migration.

The processing gas may be introduced into the chamber by a gas distributor, the gas distributor may be positioned between about 200 mils and about 700 mils from the substrate surface.

In one preferred aspect, an oxygen-doped silicon carbide layer may be deposited in one embodiment by supplying organosilicon compounds, such as trimethylsilane and 1,3,5,7-tetramethylcyclotetrasiloxane, to a plasma processing chamber at a flow rate between about 100 milligrams/minute (mgm) and about 500 mgm, respectively, at a molar ratio of oxygen-free organosilicon compounds, i.e., trimethylsilane, to oxygen-containing organosilicon compounds, i.e., 1,3,5,7-tetramethylcyclotetrasiloxane, between about 4:1 and about 1:1, supplying a noble gas at a flow rate between about 500 sccm and about 2000 sccm, maintaining a substrate temperature between about 250° C. and about 450° C., maintaining a chamber pressure between about 1 Torr and about 12 Torr and an RF power of between about 500 watts and about 1000 watts for a 200 mm substrate.

The RF power can be provided at a high frequency such as between 13 MHz and 14 MHz or a mixed frequency of the high frequency and the low frequency, for example, a high frequency of about 13.56 MHz and a low frequency of about 356 KHz. The RF power can be provided continuously or in short duration cycles wherein the power is on at the stated levels for cycles less than about 200 Hz and the on cycles total between about 10% and about 30% of the total duty cycle. The processing gas may be introduced into the chamber by a gas distributor, the gas distributor may be positioned between about 300 mils and about 450 mils from the substrate surface.

In another aspect, an oxygen-containing gas is reacted with an oxygen-free organosilicon compound, such as trimethylsilane (TMS), to deposit the oxygen-doped silicon carbide material having a dielectric constant of about 5 and less. The oxygen-containing gas generally has the formula $C_xH_yO_z$, with x being between 0 and 2, Y being between 0 and 2, where X+Y is at least 1, and Z being between 1 and 3, wherein X+Y+Z is 3 or less. Thus, the oxygen-containing gas may include carbon dioxide or water. The oxygen-containing gas is typically an inorganic material. The oxygen-containing gas and the oxygen-containing organosilicon compound described herein are considered non-oxidizing gases as compared to oxygen or ozone.

An oxygen-doped silicon carbide layer may be deposited in one embodiment by supplying oxygen-free organosilicon compounds, such as trimethylsilane, to a plasma processing chamber at a flow rate between about 10 milligrams/minute (mgm) and about 1500 mgm, supplying the oxygen containing gas at a flow rate between about 10 sccm and about 2000 sccm, at a molar ratio of oxygen-containing gas to oxygen-free organosilicon compounds between about 1:1 and about 3:1, supplying an inert gas at a flow rate between about 1 sccm and about 10000 sccm, maintaining a substrate temperature between about 0° C. and about 500° C., maintaining a chamber pressure below about 500 Torr and an RF power of between about 0.03 watts/cm$^2$ and about 1500 watts/cm$^2$.

The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle. The processing gas may be introduced into the chamber by a gas distributor, the gas distributor may be positioned between about 200 mils and about 700 mils from the substrate surface. The showerhead may be positioned between about 300 mils and about 450 mils during the deposition process.

In one preferred aspect, an oxygen-doped silicon carbide layer may be deposited in one embodiment by supplying oxygen-free organosilicon compounds, such as trimethylsilane, to a plasma processing chamber at a flow rate between about 50 milligrams/minute (mgm) and about 1000 mgm, supplying carbon dioxide at a flow rate between about 50 sccm and about 1000 sccm, supplying an inert gas at a flow rate between about 100 sccm and about 2000 sccm, maintaining a substrate temperature between about 200° C. and about 450° C., maintaining a chamber pressure between 2 Torr and 10 Torr, and an RF power of between about 10 watts and about 1000 watts.

The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle. The processing gas may be introduced into the chamber by a gas distributor, the gas distributor may be positioned between about 200 mils and about 700 mils from the substrate surface. The showerhead may be positioned between about 300 mils and about 450 mils during the deposition process.

An example of a CVD reactor that may be used with the processes herein is described in U.S. Pat. No. 5,000,113, entitled A Thermal CVD/PECVD Reactor and Use for Thermal Chemical Vapor Deposition of Silicon Dioxide and In-situ Multi-step Planarized Process, issued to Wang et al. and assigned to Applied Materials, Inc., the assignee of the present invention.

The above process parameters provide a deposition rate for the oxygen-doped silicon carbide layer in the range of about 500 Å/min to about 20,000 Å/min, such as a range between about 100 Å/min and about 3000 Å/min, when implemented on a 200 mm (millimeter) substrate in a deposition chamber available from Applied Materials, Inc., Santa Clara, Calif.

Following deposition, the deposited dielectric material may be annealed at a temperature between about 100° C. and about 400° C. for between about 1 minute and about 60 minutes, preferably at about 30 minutes, to reduce the moisture content and increase the solidity and hardness of the dielectric material, if desired. Annealing is preferably performed after the deposition of the next layer that prevents shrinkage or deformation of the dielectric layer. Inert gases, such as argon and helium, may be added to the annealing atmosphere.

The deposited oxygen-doped silicon carbide layer may be plasma treated to remove contaminants or otherwise clean the exposed surface of the oxygen-doped silicon carbide layer prior to subsequent deposition of materials thereon. The plasma treatment may be performed in the same chamber used to deposit the silicon and carbon containing material. The plasma treatment generally includes providing an inert gas including helium, argon, neon, xenon, krypton, or combinations thereof, of which helium is preferred, and/or a reducing gas including hydrogen, ammonia, and combinations thereof, to a processing chamber. The plasma treatment may be performed between about 10 seconds and about 100 seconds. The plasma treatment is believed to clean contaminants from the exposed surface of the silicon carbide material and may be used to stabilize the layer, such that it becomes less reactive with moisture and/or oxygen under atmospheric conditions as well as the adhesion of layers formed thereover.

However, it should be noted that the respective parameters might be modified to perform the plasma processes in various chambers and for different substrate sizes, such as 300 mm substrates. An example of a plasma treatment for a silicon and carbon containing film is further disclosed in U.S. patent application Ser. No. 09/336,525, entitled, "Plasma Treatment to Enhance Adhesion and to Minimize Oxidation of Carbon-Containing Layers," filed on Jun. 18, 1999, which is incorporated herein by reference to the extent not inconsistent with the disclosure and claimed aspects of the invention described herein.

A protective layer of silicon carbide can be deposited prior to the oxygen-doped silicon carbide layer to prevent side reactions between the plasma oxygen from carbon dioxide or oxygen and any exposed substrate material, such as copper. The protective layer of silicon carbide can be performed under the same conditions and precursors as the oxygen-doped silicon carbide layer deposition process in the absence of a free oxygen source, such as carbon dioxide.

An example of a pre-deposition protective layer of SiC can include supplying trimethylsilane to a plasma processing chamber at a flow rate of about 320 sccm, supplying helium at a flow rate of about 800 sccm, maintaining a substrate temperature of about 350° C., maintaining a chamber pressure of about 12 Torr, and an RF power of between about 10 watts and about 1000 watts to a layer thickness between about 50 Å and about 100 Å.

The embodiments described herein for depositing oxygen-doped silicon carbide layers are provided to illustrate the invention and the particular embodiment shown should not be used to limit the scope of the invention.

Deposition of a Barrier Layer for a Dual Damascene Structure

An example of a damascene structure that is formed using the oxygen-doped silicon carbide material described herein as a barrier layer is shown in FIG. 1. An oxygen-doped silicon carbide barrier layer 110 is generally deposited using an oxygen-free organosilicon compound and an oxygen-containing organosilicon compound according to the processes described herein on the substrate surface to reduce or minimize interlayer diffusion of material. The substrate surface may comprise metal features 107 formed in a dielectric material 105.

A first dielectric layer 112, typically an interlayer dielectric material, such as a silicon oxycarbide material (carbon doped silicon oxide) produced by oxidizing an alkylsilane in a RF energy-enhanced chemical vapor deposition process, is deposited on the oxygen-doped silicon carbide barrier layer 110 on the substrate surface including metal features 107 formed in a dielectric material 105. An example of the dielectric material for the first dielectric layer 112 and process for deposition the dielectric material is more fully described in U.S. Pat. No. 6,287,990, issued on Sep. 11, 2001, which is incorporated by reference herein to the extent not inconsistent with the description and claims herein.

An etch stop (or second barrier layer) 114 of a silicon carbide material is then deposited on the first dielectric layer 112. The etch stop 114 may be a nitrogen containing silicon carbide material. The etch stop 114 is then pattern etched to define the openings of the interconnects or contacts/vias 116 for the first dielectric layer 112. A second dielectric layer 118 is then deposited over the patterned etch stop. A photoresist is then deposited and patterned by conventional means known in the art to define the contacts/via 116. A single etch process is then performed to define the contact/vias 116 down to the etch stop and to etch the unprotected dielectric exposed by the patterned etch stop to define the contacts/vias 116. One or more conductive materials 120 such as copper are then deposited to fill the formed contacts/vias 116.

A preferred dual damascene structure fabricated in accordance with the invention including an oxygen-doped silicon carbide barrier layer deposited by the processes described herein is sequentially depicted schematically in FIGS. 2A–2H, which are cross sectional views of a substrate having the steps of the invention formed thereon.

Figure 2A:
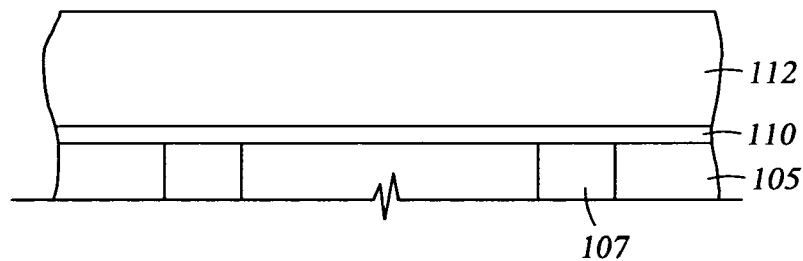
FIGS. 2A–2H are cross sectional views showing one embodiment of a dual damascene deposition sequence of the invention.

As shown in FIG. 2A, the oxygen-doped silicon carbide barrier layer 110 is deposited on the substrate surface. The oxygen-doped silicon carbide barrier layer 110 may be hypothetically deposited by a process including introducing 1,3,5,7-tetramethylcyclotetrasiloxane (TMCTS) at about 300 mgm into the processing chamber, introducing trimethylsilane (TMS) at about 360 mgm into the processing chamber, introducing helium at about 1000 sccm into the processing chamber, generating a plasma in the processing chamber by applying 950 watts of RF energy, maintaining the substrate temperature at about 350° C., maintaining the chamber pressure at about between about 8.7 Torr to deposit an oxygen-doped silicon carbide layer having an oxygen content less than about 15 atomic %. The spacing between the gas distributor and the substrate surface is about 515 mils.

While not shown, a capping layer of nitrogen free silicon carbide may be deposited on the barrier layer 110. The nitrogen free silicon carbide capping layer may be deposited in situ by the nitrogen doped silicon carbide process with the source of nitrogen minimized or eliminated during the deposition process.

The oxygen-doped silicon carbide barrier layer 110 may be plasma treated with an inert gas including helium (He), argon (Ar), neon (Ne), and combinations thereof, and/or a reducing gas including hydrogen, ammonia, and combinations thereof. The plasma treatment may be performed in situ with the deposition of the oxygen-doped silicon carbide material.

A first dielectric layer 112 of interlayer dielectric material, such as a silicon oxycarbide from an oxidized organosilane or organosiloxane, such as trimethylsilane, is deposited on the first oxygen-doped silicon carbide barrier layer 110 to a thickness of about 5,000 to about 15,000 Å, depending on the size of the structure to be fabricated. Example of a low dielectric constant material that may be used as an interlayer dielectric material is Black Diamond™ and Silk™ commercially available from Applied Materials, Inc., of Santa Clara, Calif. The first dielectric layer may also comprise other low k dielectric materials including a low polymer material, such as paralyne, or a low k spin-on glass such as un-doped silicon glass (USG) or fluorine-doped silicon glass (FSG).

The first dielectric layer 112 may then be treated by a plasma process including helium or a reducing gas, such as hydrogen, at a power level of between about 600 watts and about 800 watts for between about 40 seconds and about 60 seconds for a 200 millimeter substrate. The processing chamber is maintained at a pressure of about 20 Torr or less and at a substrate temperature of about 450° C. or less during the reactive clean process.

Figure 2B:
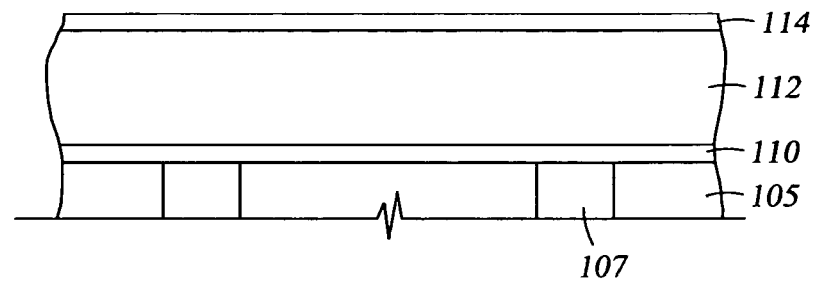
Figure 2C:
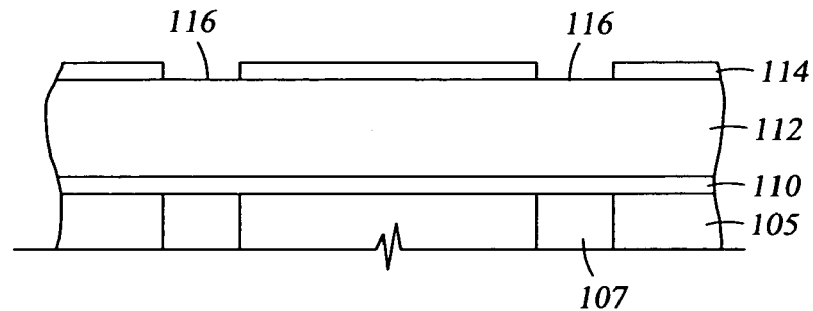

As shown in FIG. 2B, the low k etch stop 114, which may be a silicon carbide material is then deposited on the first dielectric layer to a thickness of about 200 to about 1000 Å. The low k etch stop 114 may be plasma treated as described herein for the oxygen-doped silicon carbide barrier layer 110. The low k etch stop 114 is then pattern etched to define the contact/via openings 116 and to expose first dielectric layer 112 in the areas where the contacts/vias are to be formed as shown in FIG. 2C. Preferably, the low k etch stop 114 is pattern etched using conventional photolithography and etch processes using fluorine, carbon, and oxygen ions. While not shown, a nitrogen-free silicon carbide or silicon oxide cap layer between about 100 Å and about 500 Å thick may be deposited on the etch stop 116 prior to depositing further materials.

Figure 2D:
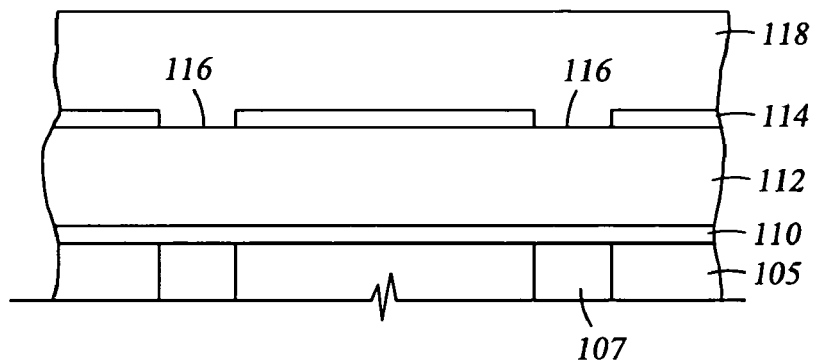

After low k etch stop 114 has been etched to pattern the contacts/vias and the photoresist has been removed, a second dielectric layer 118 of silicon oxycarbide is deposited to a thickness of about 5,000 to about 15,000 Å as shown in FIG. 2D. The second dielectric layer 118 may be plasma treated with helium or a reducing gas, such as hydrogen, at a power level of between about 600 watts and about 800 watts for between about 40 seconds and about 60 seconds for a 200 millimeter substrate. The processing chamber is maintained at a pressure of about 20 Torr or less and at a substrate temperature of about 450° C. or less during the reactive clean process. The plasma treatment is believed to reduce the reactivity of the surface of the layer 118 to subsequently deposited materials.

In an alternative embodiment, a nitrogen-free silicon carbide or silicon oxide cap layer between about 100 Å and about 500 Å thick may be deposited on second dielectric layer 118 prior to depositing additional materials, such as photoresist materials.

Figure 2E:
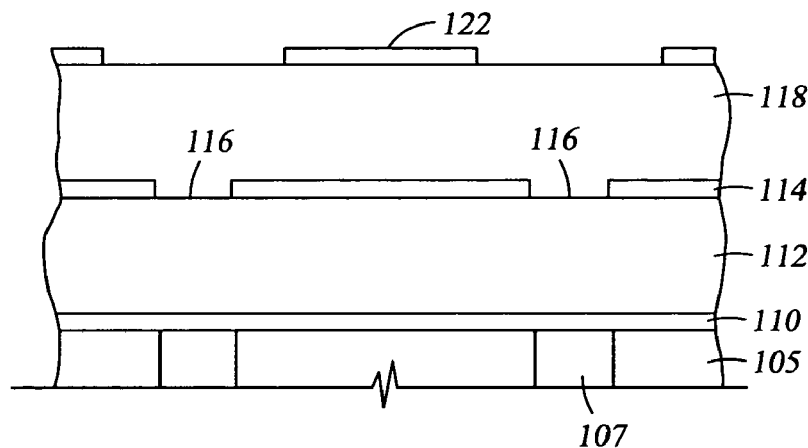
Figure 2F:
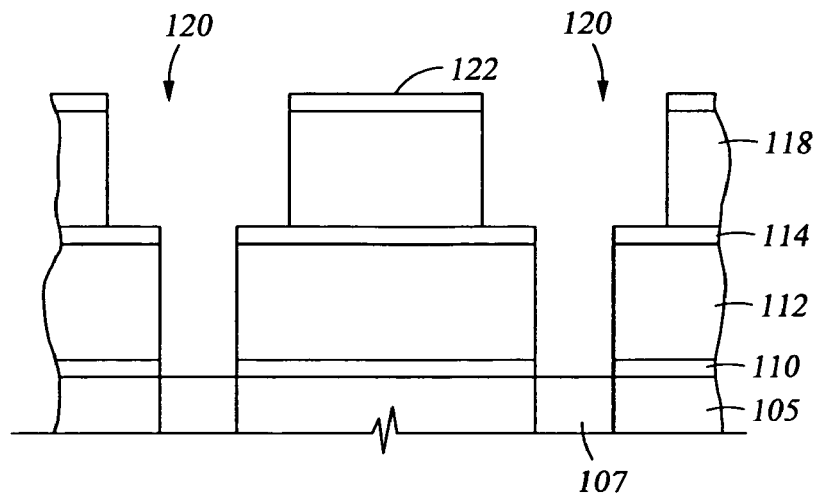

A photoresist material 122 is then deposited on the second dielectric layer 118 and patterned preferably using conventional photolithography processes to define the interconnect lines 120 as shown in FIG. 2E. The photoresist material 122 comprises a material conventionally known in the art, preferably a high activation energy photoresist, such as UV-5, commercially available from Shipley Company Inc., of Marlborough, Mass. The interconnects and contacts/vias are then etched using reactive ion etching or other anisotropic etching techniques to define the metallization structure (i.e., the interconnect and contact/via) as shown in FIG. 2F. Any photoresist or other material used to pattern the etch stop 114 or the second dielectric layer 118 is removed using an oxygen strip or other suitable process.

Figure 2G:
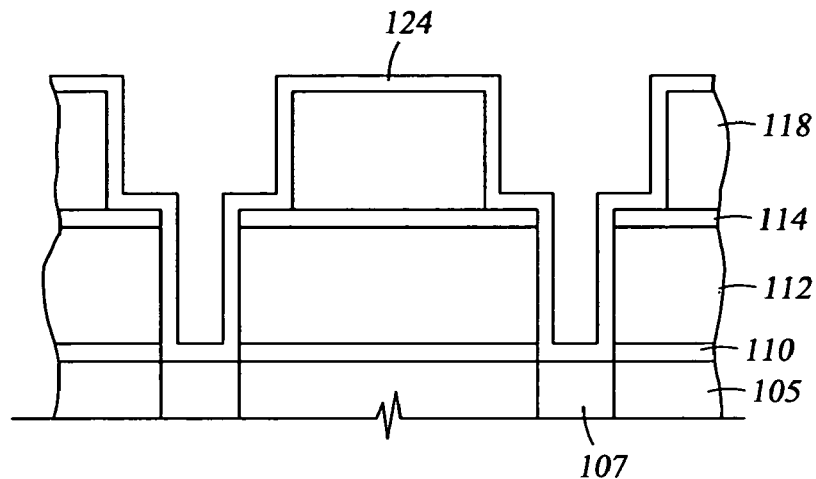
Figure 2H:
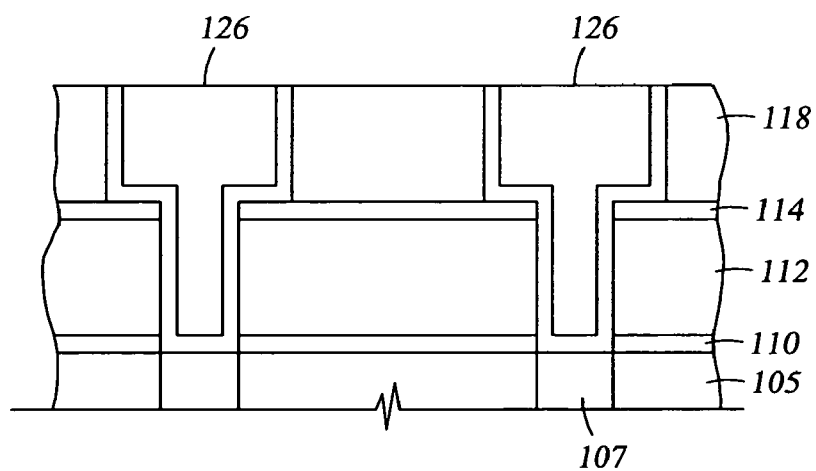

The metallization structure is then formed with a conductive material such as aluminum, copper, tungsten or combinations thereof. Presently, the trend is to use copper to form the smaller features due to the low resistivity of copper (1.7 mW-cm compared to 3.1 mW-cm for aluminum). Preferably, as shown in FIG. 2G, a suitable barrier layer 124 such as tantalum nitride is first deposited conformally in the metallization pattern to prevent copper migration into the surrounding silicon and/or dielectric material. Thereafter, copper 126 is deposited using either chemical vapor deposition, physical vapor deposition, electroplating, or combinations thereof to form the conductive structure. Once the structure has been filled with copper or other metal, the surface is planarized using chemical mechanical polishing, as shown in FIG. 2H.

Deposition of a Dual Damascene Structure

In an alternative embodiment of the damascene structure, the oxygen-doped silicon carbide material described herein may be deposited as a hardmask layer over a dielectric layer prior to depositing the photoresist material for improving damascene formation and protecting the k material of the damascene structure when etching the metallization structure. An example of a damascene structure that is formed using an oxygen doped silicon carbide film as a hardmask the silicon carbide described herein is shown in FIGS. 3A–G, which are cross sectional views of a substrate having the steps of the invention formed thereon.

Figure 3A:
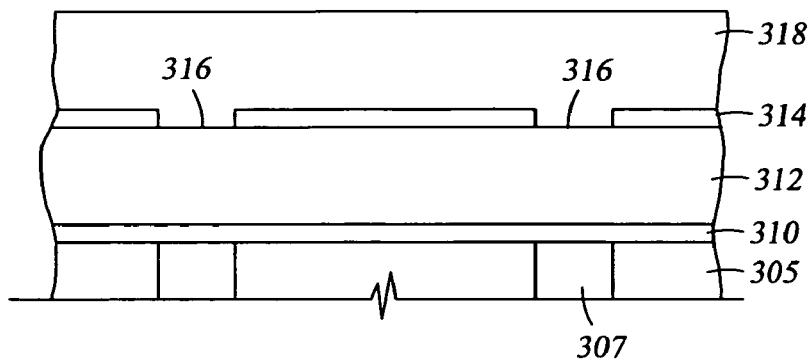
FIGS. 3A–3G are cross sectional views showing one embodiment of a dual damascene deposition sequence of the invention.

As shown in FIG. 3A, a silicon carbide barrier layer 310 is deposited on the substrate surface to eliminate inter-level diffusion between the substrate and subsequently deposited material. The substrate surface may comprise metal features 307 formed in a dielectric material 305. The silicon carbide barrier layer 310 may be doped with oxygen, boron, phosphorus, or combinations thereof.

A first dielectric layer 312, comprising silicon, oxygen, and carbon, as described herein is deposited on the silicon carbide barrier layer 310 on the substrate surface including metal features 307 formed in a dielectric material 305. The first dielectric layer 312 of interlayer dielectric material is deposited on the first silicon carbide barrier layer 310 by oxidizing an organosilane or organosiloxane, such as trimethylsilane, to a thickness of about 5,000 to about 15,000 Å, depending on the size of the structure to be fabricated.

Examples of a low dielectric constant material that may be used as an interlayer dielectric material is Black Diamond™ and Silk™ commercially available from Applied Materials, Inc., of Santa Clara, Calif. Alternatively, the first dielectric layer may also comprise other low k dielectric material such as a low k polymer material including paralyne or a low k spin-on glass such as un-doped silicon glass (USG) or fluorine-doped silicon glass (FSG). A plasma process following deposition as described herein for the silicon oxycarbide layer may then treat the first dielectric layer 312.

A low k etch stop (or second barrier layer) 314 of a silicon carbide material or oxidized organo silane layer is then deposited on the first dielectric layer 312 to a thickness of about 200 to about 1000 Å. Alternatively, the etch stop 314 may be a nitrogen containing silicon carbide material. The low k etch stop 314 is then pattern etched to define the contact/via openings 316 and to expose first dielectric layer 312 in the areas where the contacts/vias are to be formed as shown in FIG. 3A. Preferably, the low k etch stop 314 is pattern etched using conventional photolithography and etch processes using fluorine, carbon, and oxygen ions. While not shown, a nitrogen-free silicon carbide or silicon oxide cap layer between about 100 Å and about 500 Å thick may be deposited on the etch stop 316 prior to depositing further materials.

After the low k etch stop 314 has been etched to pattern the contacts/vias for the first dielectric layer 312 and the photoresist has been removed, a second dielectric layer 318 of silicon oxycarbide as described herein is deposited to a thickness of about 5,000 to about 15,000 Å as shown in FIG. 3A. The second dielectric layer 318 may also be plasma treated as described herein for the silicon oxycarbide layer.

In an alternative embodiment, a nitrogen-free silicon carbide or silicon oxide cap layer between about 100 Å and about 500 Å thick may be deposited on second dielectric layer 318 prior to depositing additional materials, such as photoresist materials. In a further alternative embodiment, a silicon carbide cap layer (not shown) may be deposited on the second dielectric layer 318 prior to depositing additional materials, such as photoresist materials.

Figure 3B:
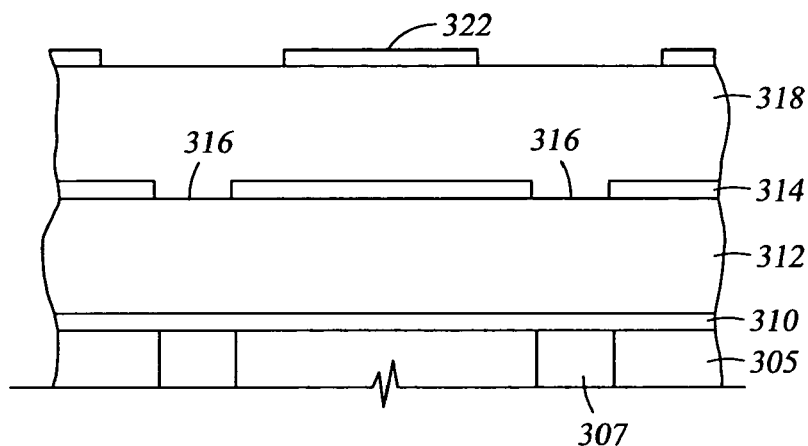

An oxygen doped silicon carbide hardmask layer 322 is then deposited on the second dielectric layer 318 (or cap layer) and patterned preferably using conventional photolithography processes to define the interconnect lines 320 as shown in FIG. 3B. The oxygen doped silicon carbide hardmask layer 322 is a hardmask which may perform as a stop for chemical mechanical polishing techniques to allow removal of conductive material while protecting low k dielectric materials, such as the second dielectric layer 318, from damage during etching or from polishing methods.

The oxygen-doped silicon carbide hardmask has a hardness of greater than 1 gPa, for example, greater than about 1.5 gPa. Generally, the silicon oxycarbide hardmask has a porosity of less than about 2% to prevent oxidative diffusion and moisture diffusion into the underlying dielectric layer. The hardness of the silicon oxycarbide hardmask allows the hardmask to serve as a polishing stop during chemical mechanical polishing (CMP). CMP does not remove the hardmask, and thus, the hardmask protects underlying layers from overpolishing. The hardmask layer 322 has exhibited a polishing selectivity, i.e., a removal rate ratio, of oxide to oxygen-doped silicon carbide of about 4:1 or greater, such as 4.6:1, and in some instances, has exhibited a polishing selectivity of about 6:1 or greater between oxide to oxygen-doped silicon carbide.

The oxygen doped silicon carbide hardmask layer 322 is deposited as described herein. An example of a hardmask deposition for silicon carbide includes introducing 1,3,5,7-tetramethylcyclotetrasiloxane (TMCTS) at about 1000 mgm into the processing chamber, introducing helium at about 500 sccm into the processing chamber, generating a plasma in the processing chamber by applying 335 watts of RF energy, maintaining the substrate temperature at about 350° C., maintaining the chamber pressure at about between about 4 Torr to deposit an oxygen-doped silicon carbide layer having an oxygen content less than about 15 atomic %. The spacing between the gas distributor and the substrate surface is about 300 mils. The hardmask has a deposition rate of about 2115 Å/min, a dielectric constant of about 3.2 and a polish selectivity of oxide to oxygen-doped silicon carbide of about 4.6:1.

Figure 3C:
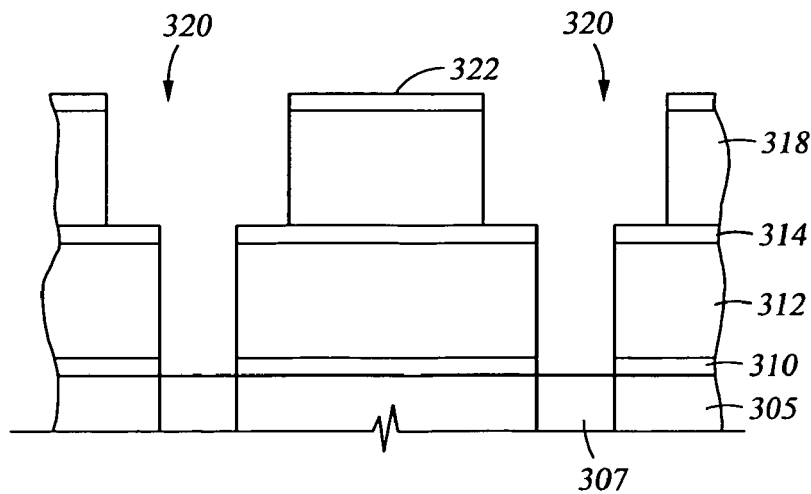
Figure 3D:
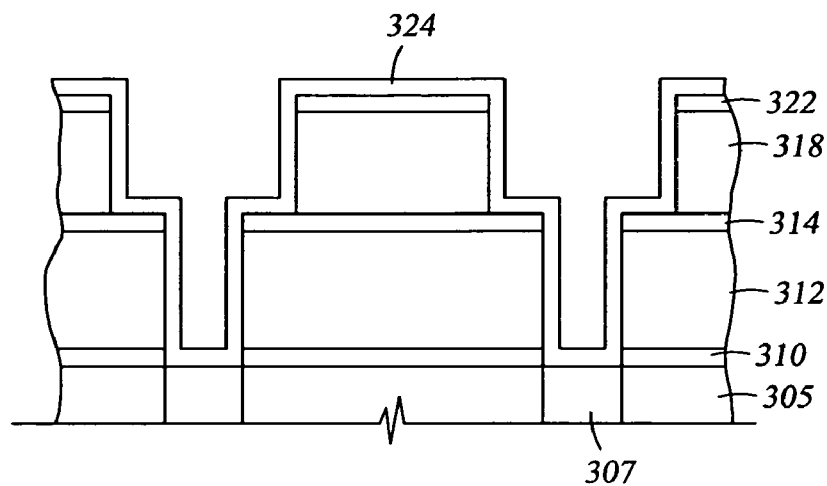
Figure 3E:
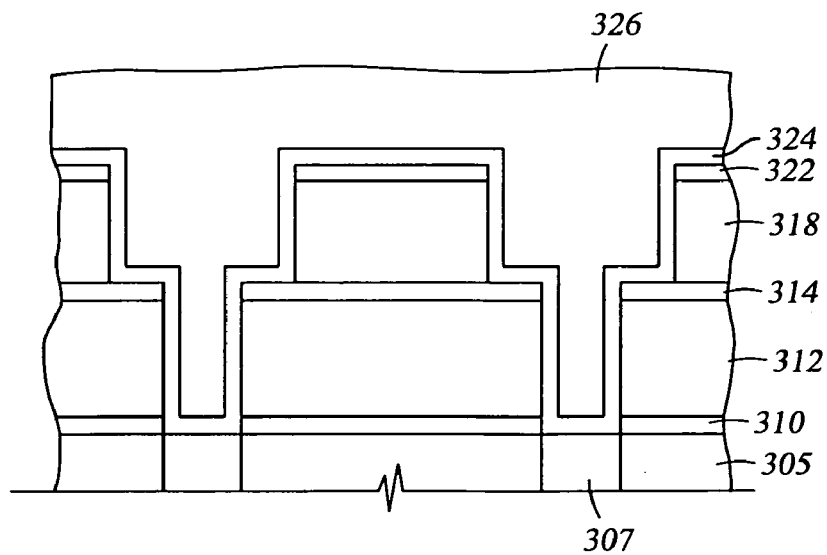

The features are then etched through to the second dielectric layer 318, the low k etch stop 314, the first dielectric layer 312, and the silicon carbide barrier layer 310 as shown in FIG. 3C. The interconnect lines 320 are filled to form a metallization structure with a conductive material such as aluminum, copper, tungsten or combinations thereof. Presently, the trend is to use copper to form the smaller features due to the low resistivity of copper (1.7 mW-cm compared to 3.1 mW-cm for aluminum). Preferably, as shown in FIG. 3D, a suitable barrier layer 324 such as tantalum or tantalum nitride is first deposited conformally in the metallization pattern to prevent copper migration into the surrounding silicon and/or dielectric material. Thereafter, copper 326 is deposited using either chemical vapor deposition, physical vapor deposition, electroplating, or combinations thereof to fill the structure as shown in FIG. 3E.

Figure 3F:
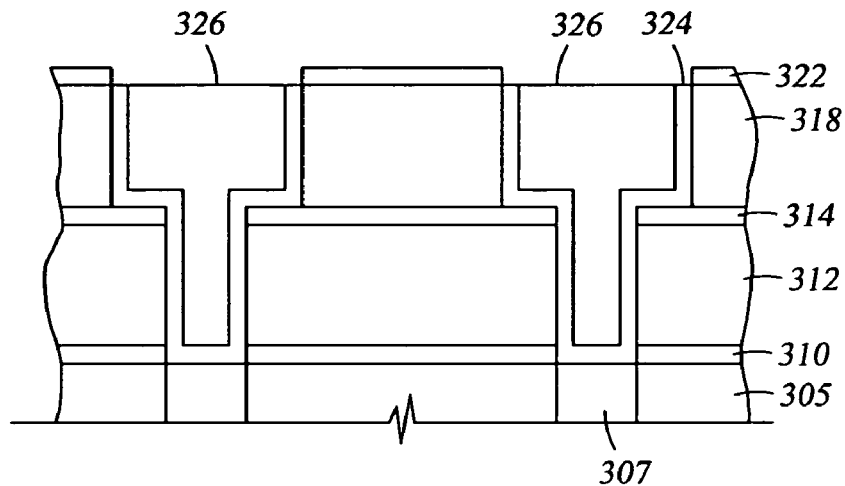
Figure 3G:
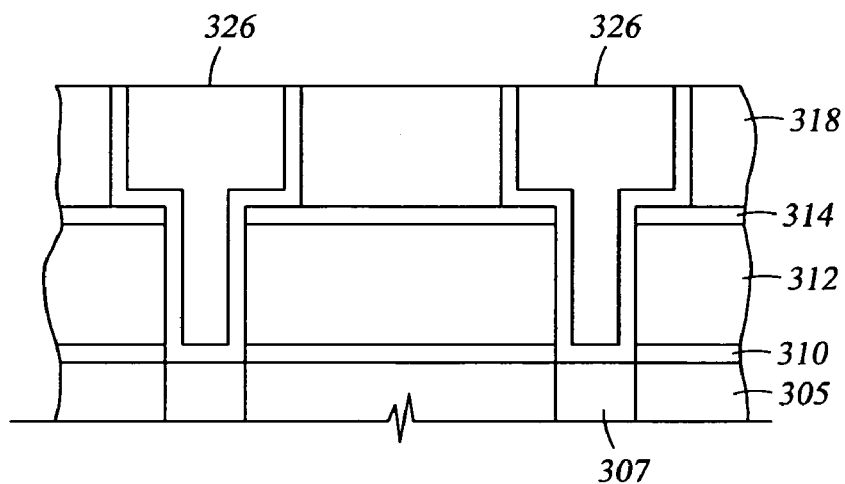

Once the structure has been filled with copper or other metal, the surface is planarized using chemical mechanical polishing. However, the polishing resistant oxygen doped silicon carbide hardmask layer 322 may remain behind after the polishing process as shown in FIG. 3F. The oxygen doped silicon carbide hardmask layer 322 may be removed by a plasma process from the surface of the substrate.

EXAMPLES

Organosilicon compounds described herein were deposited as barrier layers on substrate surface and analyzed. In one example, a silicon carbide film was deposited from a mixed precursor processing gas containing an oxygen-containing organosilicon precursor and an oxygen-free organosilicon compound and compared to a silicon carbide film from a conventional silicon carbide precursor, trimethylsilane.

An oxygen-doped silicon carbide barrier layer was deposited by a mixed precursor process including introducing 1,3,5,7-tetramethylcyclotetrasiloxane (TMCTS) at about 300 mgm into the processing chamber, introducing trimethylsilane (TMS) at about 360 mgm into the processing chamber, introducing helium at about 1000 sccm into the processing chamber, generating a plasma in the processing chamber by applying 950 watts of RF energy, maintaining the substrate temperature at about 350° C., maintaining the chamber pressure at about between about 8.7 Torr to deposit an oxygen-doped silicon carbide layer. The spacing between the gas distributor and the substrate surface is about 515 mils.

The deposited films were examined and analyzed for dielectric constant and barrier layer diffusion. The mixed precursor processing gas silicon carbide film had a measured dielectric constant of about 4 and the trimethylsilane silicon carbide film had a measured dielectric constant of about 4.3.

The barrier layer properties were tested by a Bias Temperature test, which was performed by forming a damascene device using the above described silicon carbide films and subjecting the deposited films to a substrate temperature of about 275° C. while measuring leakage current for a device. Leakage current increases with degrading barrier layer properties. When leakage current reaches about $10^{-3}$ amps/cm$^2$, the barrier layer is considered to have failed. When 50% of the devices failed under these processing conditions, the time was measured to indicate barrier effectiveness for the deposited films. Comparison of the films indicated that the mixed precursor silicon carbide had a leakage current of about $1.25e^{-09}$ amps/cm$^2$ at 1 mega volts/cm (MV/cm) and about $1.98e^{-8}$ amps/cm$^2$ at 2 MV/cm and had a 50% failure rate after about 3.7 hours while the trimethylsilane silicon carbide film had a leakage current of about $1e^{-09}$ amps/cm$^2$ at 1 MV/cm and about $1e^{-6}$ amps/cm$^2$ at 2 MV/cm and had a 50% failure rate after about 4.4 hours.

A oxygen-doped silicon carbide barrier layer was deposited by reacting carbon dioxide and trimethylsilane (TMS), the process including introducing carbon dioxide at about 320 sccm into the processing chamber, introducing trimethylsilane (TMS) at about 320 mgm into the processing chamber, introducing helium at about 1000 sccm into the processing chamber, generating a plasma in the processing chamber by applying 460 watts of RF energy, maintaining the substrate temperature at about 350° C., maintaining the chamber pressure at about 2.5 Torr to deposit an oxygen-doped silicon carbide layer. The spacing between the gas distributor and the substrate surface is about 400 mils. This process provided a deposition rate of about 1244 Å/min.

In order to prevent initial the oxygen-containing plasma, for example the $CO_2$, from oxidizing exposed portion of the substrate surface, a pre-deposition protective layer of SiC was deposited by supplying trimethylsilane to a plasma processing chamber at a flow rate of about 320 sccm, supplying helium at a flow rate of about 800 sccm, maintaining a substrate temperature of about 350° C., maintaining a chamber pressure of about 12 Torr, and an RF power of between about 10 watts and about 1000 watts to a layer thickness between about 50 Å and about 100 Å.

The deposited films were examined and analyzed for dielectric constant and barrier layer diffusion. The carbon dioxide deposited silicon carbide film had a measured dielectric constant of about 4.2 and the trimethylsilane silicon carbide film had a measured dielectric constant of about 4.3. The deposited silicon carbide film also has a reflective index of 1.9128 and a compressive stress level of $1.27E^9$ dynes/cm$^2$.

Additionally, the stress of the SiC barrier was observed to be controllable or "tuned" by the application of low frequency RF during the deposition process. For example, an application of 25 watts at 356 KHz was observed to increase the compressive stress of a SiC film from about $1.6 E^9$ dynes/cm$^2$ to about $2.2E^9$ dynes/cm$^2$, which is desirable to reduce copper stress migration.

The barrier layer properties were tested by a Bias Temperature test, which was performed by forming a damascene device using the above described silicon carbide films and subjecting the deposited films to a substrate temperature of about 275° C. while measuring leakage current for a device. Leakage current increases with degrading barrier layer properties. When leakage current reaches about $10^{-3}$ amps/cm$^2$, the barrier layer is considered to have failed. When 50% of the devices failed under these processing conditions, the time was measured to indicate barrier effectiveness for the deposited films. Comparison of the films indicated that the mixed precursor silicon carbide had a leakage current of about $8e^{-10}$ amps/cm$^2$ at 1 mega volts/cm (MV/cm) and about $4e^{-8}$ amps/cm$^2$ at 2 MV/cm and had a 50% failure rate after more than about 10 hours, for example, one substrate had a failure at about 18 hours, while the trimethylsilane silicon carbide film had a leakage current of about $1 e^{-09}$ amps/cm$^2$ at 1 MV/cm and about $1 e^{-6}$ amps/cm$^2$ at 2 MV/cm and had a 50% failure rate after about 4.4 hours.

This data indicates a significant and unexpected improvement in barrier layer properties and dielectric constant for mixed precursor processing gas in comparison to available barrier layer processes.

Additionally, the oxygen-doped silicon carbide barrier layer deposited by reacting carbon dioxide and trimethylsilane (TMS) described above and an oxygen-doped silicon carbide barrier layer deposited by reacting oxygen ($O_2$) under similar processing conditions as the examples were compared. The carbon dioxide and TMS layer was deposited at a rate between about 1000 Å/min and about 2000 Å/min and the layer properties were observed to be: a dielectric constant between about 3.8 and about 4.8, with an average of about 4.2, a hardness between about 1.5 GPa and about 3 GPa, and a compressive stress of about $1.6e^9$ dynes/cm$^2$. The oxygen and TMS layer was deposited at a rate of about 6000 Å/min or greater and the layer properties were observed to be: a dielectric constant between about 2.7 and about 3.48, with an average of about 2.8, a hardness between about 1.5 GPa and about 3 GPa, and a tensile stress of about $5e^8$ dynes/cm². Minimal or reduced damage to underlying low k materials was observed for the carbon monoxide and TMS layer compared to the oxygen and TMS layer.

While the foregoing is directed to preferred embodiments of the present invention, other and further embodiments of the invention may be devised without departing from the basic scope thereof, and the scope thereof is determined by the claims which follow.

What is claimed is:

1. A method for processing a substrate, comprising:
positioning a substrate in a processing chamber;
introducing a processing gas comprising a compound comprising oxygen and carbon and an oxygen-free organosilicon compound; and
generating a plasma of the processing gas by applying a mixed frequency RF power to deposit an oxygen-doped silicon carbide layer having an oxygen content of about 15 atomic percent or less on the substrate.

2. The method of claim 1, wherein the compound comprising oxygen and carbon has the formula $C_xH_yO_z$, with X being between 0 and 2, Y being between 0 and 2, and Z being between 1 and 3. wherein X+Y is at least 1 and X+Y+Z is 3 or less.

3. The method of claim 2, wherein the compound comprising oxygen and carbon is selected from the group consisting of carbon dioxide, carbon monoxide, and combinations thereof.

4. The method of claim 1, wherein the oxygen-free organosilicon compound comprises an organosilane compound selected from the group consisting of methylsilane, dimethylsilane, trimethylsilane, ethylsilane, disilanomethane, bis(m-ethylsilano)methane, 1,2-disilanoethane, 1,2-bis(methylsilano)ethane, 2,2-disilanopropane, 1,3,5-trisilano-2,4,6-trimethylene, and combinations thereof.

5. The method of claim 1, wherein the mixed frequency RF power comprises a first frequency between 13 MHz and 14 MHz and a second frequency RF power is between 100 KHz and 1 MHz.

6. The method of claim 5, wherein the first frequency RF power is about 13.56 MHz and the second frequency RF power is about 356 KHz.

7. The method of claim 5, wherein the mixed frequency RF power is provided in a continuous cycle.

8. The method of claim 5, wherein the mixed frequency RF power is provided in a cycle of a short duration wherein the power is on at a stated level for an on cycle less than about 200 Hz and the on cycles total between about 10% and about 30% of a total cycle.

9. The method of claim 5, wherein the mixed frequency RF power is between about 10 watts and 1000 watts.

10. The method of claim 1, wherein the processing gas further comprises an inert gas selected from the group consisting of helium, argon, neon, xenon, krypton or combinations thereof.

11. The method of claim 1, further comprising exposing the substrate to a plasma of a reducing gas selected from the group consisting of hydrogen, ammonia or combinations thereof.

12. The method of claim 1, further comprising exposing the substrate to a plasma of an inert gas selected from the group consisting of helium, argon, neon, xenon, krypton or combinations thereof.

13. The method of claim 1, wherein the compound comprising oxygen and carbon is carbon dioxide, the oxygen-free organosilicon compound is trimethylsilane, and the inert gas is helium.

14. The method of claim 1, further comprising:
depositing a first dielectric layer on the oxygen-doped silicon carbide layer;
depositing a second oxygen-doped silicon layer on the first dielectric layer; and then
etching feature definitions in the second oxygen-doped silicon carbide layer to expose the first dielectric layer.

15. A method for processing a substrate comprising:
positioning a substrate in a processing chamber;
introducing a processing gas comprising a compound comprising oxygen and carbon and an oxygen-free organosilicon compound;
generating a plasma of the processing gas by applying a mixed frequency RF power comprising a first frequency RF power is between 13 MHz and 14 MHz and a second frequency RF power is between 100 KHz and 1 MHz at a power density between about 0.03 watts/cm² and about 1500 watts/cm² to deposit an oxygen-doped silicon carbide layer having an oxygen content of about 15 atomic percent or less on the substrate; and
exposing the deposited oxygen doped-silicon carbide layer to an in situ plasma of an inert gas.

16. The method of claim 15, wherein the inert gas selected from the group consisting of helium, argon, neon, xenon, krypton or combinations thereof.

17. The method of claim 15, wherein the mixed frequency RF power is between about 10 watts and 1000 watts.

18. The method of claim 17, wherein the mixed frequency RF power is provided in a continuous cycle or the mixed frequency RF power is provided in a cycle of a short duration wherein the power is on at a stated level for an on cycle less than about 200 Hz and the on cycles total between about 10% and about 30% of a total cycle.

19. The method of claim 15, wherein the compound comprising oxygen and carbon has the formula $C_xH_yO_z$, with X being between 0 and 2, Y being between 0 and 2, and Z being between 1 and 3, wherein X+Y is at least 1 and X+Y+Z is 3 or less.

20. The method of claim 19, wherein the compound comprising oxygen and carbon is selected from the group consisting of carbon dioxide, carbon monoxide, water, and combinations thereof.

21. The method of claim 19, wherein the processing gas further comprises an inert gas selected from the group consisting of helium, argon, neon, xenon, krypton or combinations thereof.

22. The method of claim 20. wherein the compound comprising oxygen and carbon is carbon dioxide, the oxygen-free organosilicon compound is trimethylsilane, and the inert gas is helium.

23. The method of claim 15, wherein the mixed frequency RF power comprises a first frequency RF power between 13 MHz and 14 MHz and a second frequency RF power between 100 KHz and 1 MHz.

* * * * *

UNITED STATES PATENT AND TRADEMARK OFFICE
CERTIFICATE OF CORRECTION

PATENT NO. : 7,151,053 B2
APPLICATION NO. : 11/118678
DATED : December 19, 2006
INVENTOR(S) : Lee et al.

It is certified that error appears in the above-identified patent and that said Letters Patent is hereby corrected as shown below:

Column 3, Line 5: Before "hardmask", change "an" to --a--

Column 5, Line 34: Change "ration" to --ratio--

Column 15, Claim 4, Line 34: Change "bis(m-ethylsilano)methane" to --bis(methylsilano)methane--

Signed and Sealed this

Eighth Day of May, 2007

JON W. DUDAS
*Director of the United States Patent and Trademark Office*